(12) United States Patent
Liu et al.

(10) Patent No.: US 12,101,920 B2
(45) Date of Patent: Sep. 24, 2024

(54) CONDUCTIVE POLYMERIC LAYERS FOR CHARGE DISSIPATION

(71) Applicant: ENTEGRIS, INC., Billerica, MA (US)

(72) Inventors: Yuxuan Liu, Wayland, MA (US); Zhifeng Li, Acton, MA (US); Carlo Waldfried, Middleton, MA (US); Yan Liu, Lexington, MA (US); Chandra Venkatraman, Tyngsboro, MA (US); Pushkara Rao Varanasi, Poughkeepsie, NY (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 18/131,208

(22) Filed: Apr. 5, 2023

(65) Prior Publication Data

US 2023/0337407 A1    Oct. 19, 2023

Related U.S. Application Data

(60) Provisional application No. 63/330,923, filed on Apr. 14, 2022.

(51) Int. Cl.
| | |
|---|---|
| *H05K 9/00* | (2006.01) |
| *H01B 1/00* | (2006.01) |
| *H01B 1/12* | (2006.01) |
| *H01L 21/683* | (2006.01) |

(52) U.S. Cl.
CPC ........... *H05K 9/0079* (2013.01); *H01B 1/124* (2013.01); *H01L 21/6833* (2013.01)

(58) Field of Classification Search
CPC .......... H01B 1/00; H01B 1/124; H01B 1/128; H02N 13/00; H05K 9/0079; H01L 21/6833
See application file for complete search history.

(56) References Cited

U.S. PATENT DOCUMENTS

| 6,117,246 A | * | 9/2000 | Parkhe | H01L 21/6833 118/728 |
| 7,495,881 B2 | * | 2/2009 | Kameyama | H01L 21/6831 361/231 |
| 2006/0120010 A1 | | 6/2006 | Kameyama | |
| 2013/0120897 A1 | * | 5/2013 | Lin | H02N 13/00 216/48 |
| 2015/0294891 A1 | | 10/2015 | Lin | |

FOREIGN PATENT DOCUMENTS

| EP | 0725426 A2 | 8/1996 |
| JP | 2000164684 A | 6/2000 |
| WO | 2014126896 A1 | 8/2014 |

\* cited by examiner

*Primary Examiner* — Mark Kopec

(57) ABSTRACT

A conductive polymeric layer on an electrostatic chuck. The conductive polymeric layer comprises a conductive polymer and a photosensitive polymer. The conductivity of the conductive polymer promotes charge dissipation by the conductive polymeric layer, while the photosensitivity of the photosensitive polymer allows the surface of the conductive polymeric layer to be photopatterned. The extent to which the conductive polymeric layer is conductive and photosensitive may be modulated by varying the relative amounts of the conductive polymer and the photosensitive polymer.

17 Claims, 2 Drawing Sheets

CONDUCTIVE POLYMERIC LAYERS FOR CHARGE DISSIPATION

FIELD

The present disclosure relates to conductive polymeric layers useful for charge dissipation and related methods.

BACKGROUND

Semiconductor processing uses electrical insulating materials. These materials are susceptible to electrostatic charge buildup at the surfaces of these materials. This buildup of electrostatic charge can delay processes, damage components, or cause injury.

SUMMARY

Some embodiments relate to a device comprising an electrostatic chuck; and a conductive polymeric layer on the electrostatic chuck. In some embodiments, the conductive polymeric layer comprises a conductive polymer and a photosensitive polymer.

In some embodiments, the electrostatic chuck is configured for securing a substrate by application of an electrostatic force.

In some embodiments, the conductive polymeric layer has a sheet resistance of $10^{12}$ ohms per square or less.

In some embodiments, the conductive polymeric layer has a Young's modulus of 3.5 gigapascals (GPa) or less.

In some embodiments, the photosensitive polymer comprises at least one of benzocyclobutene (BCB), polybenzoxazole (PBO), epoxy, polyimide, or any combination thereof.

In some embodiments, the conductive polymer comprises at least one of polyacetylene (PAC), polyfluorene, polyphenylene, polyphenylene vinylene, polypyrene, polyazulene, polynaphthalene, polypyrrole (PPY), polycarbazole, polyindole, polyazepine, polyaniline (PANI), polyacene, polythiophene (PT), polythiophene vinylene, poly(p-phenylene sulfide) (PPS), poly(p-phenylene vinylene) (PPV), polypyridine, poly(3,4-ethylenedioxythiophene) (PEDOT), polystyrene sulfonate (PSS), poly(triaryl amine) (PTAA), poly(hydrooxymethyl 3,4-ethylenedioxythiphene) (PEDOT-OH), or any combination thereof.

In some embodiments, the conductive polymeric layer comprises a crosslinked photosensitive polymer. In some embodiments, the conductive polymeric layer comprises a photopatterned surface.

In some embodiments, the conductive polymeric layer does not comprise a metal contaminant.

In some embodiments, the metal contaminant comprises at least one chromium, manganese, hafnium, iron, aluminum, magnesium, potassium, sodium, calcium, strontium, barium, copper, lead, zinc, tin, cobalt, nickel, antimony, mercury, cadmium, bismuth, gold, silver, platinum, ruthenium, rhodium, palladium, iridium, beryllium, lithium, cesium, titanium, zirconium, vanadium, niobium, tantalum, tungsten, molybdenum, gallium, indium, thallium, germanium, rhenium, lanthanum, cerium, praseodymium, neodymium, samarium, europium, gadolinium, terbium, dysprosium, holmium, erbium, thulium, ytterbium, lutetium, scandium, yttrium, thorium, or any combination thereof.

Some embodiments relate to an electrostatic chuck comprising a conductive polymeric layer on the electrostatic chuck. In some embodiments, the conductive polymeric layer comprises a conductive polymer and a photosensitive polymer.

In some embodiments, the conductive polymeric layer has a sheet resistance of $10^{12}$ ohms per square or less.

In some embodiments, the conductive polymeric layer has a Young's modulus of 3.5 gigapascals (GPa) or less.

In some embodiments, the photosensitive polymer comprises at least one of benzocyclobutene (BCB), polybenzoxazole (PBO), epoxy, polyimide, or any combination thereof.

In some embodiments, the conductive polymer comprises at least one of polyacetylene (PAC), polyfluorene, polyphenylene, polyphenylene vinylene, polypyrene, polyazulene, polynaphthalene, polypyrrole (PPY), polycarbazole, polyindole, polyazepine, polyaniline (PANI), polyacene, polythiophene (PT), polythiophene vinylene, poly(p-phenylene sulfide) (PPS), poly(p-phenylene vinylene) (PPV), polypyridine, poly(3,4-ethylenedioxythiophene) (PEDOT), polystyrene sulfonate (PSS), poly(triaryl amine) (PTAA), poly(hydrooxymethyl 3,4-ethylenedioxythiphene) (PEDOT-OH), or any combination thereof.

In some embodiments, the conductive polymeric layer comprises a crosslinked photosensitive polymer. In some embodiments, the conductive polymeric layer comprises a photopatterned surface.

In some embodiments, the conductive polymeric layer does not comprise a metal contaminant.

In some embodiments, the metal contaminant comprises at least one chromium, manganese, hafnium, iron, aluminum, magnesium, potassium, sodium, calcium, strontium, barium, copper, lead, zinc, tin, cobalt, nickel, antimony, mercury, cadmium, bismuth, gold, silver, platinum, ruthenium, rhodium, palladium, iridium, beryllium, lithium, cesium, titanium, zirconium, vanadium, niobium, tantalum, tungsten, molybdenum, gallium, indium, thallium, germanium, rhenium, lanthanum, cerium, praseodymium, neodymium, samarium, europium, gadolinium, terbium, dysprosium, holmium, erbium, thulium, ytterbium, lutetium, scandium, yttrium, thorium, or any combination thereof.

Some embodiments relate to a method comprising one or more of the following steps: obtaining a solution comprising a conductive polymer and a photosensitive polymer; depositing the solution on at least a portion of a surface of an electrostatic chuck; applying a photolithography mask so as to define exposed portions of the solution and unexposed portions of the solution; exposing the solution to light so as to cure the exposed portions of the solution; developing the solution so as to remove the unexposed portions of the solution; and heating the solution to a temperature sufficient to remove at least a portion of a solvent from the solution.

In some embodiments, the conductive polymer comprises at least one of polyacetylene (PAC), polyfluorene, polyphenylene, polyphenylene vinylene, polypyrene, polyazulene, polynaphthalene, polypyrrole (PPY), polycarbazole, polyindole, polyazepine, polyaniline (PANI), polyacene, polythiophene (PT), polythiophene vinylene, poly(p-phenylene sulfide) (PPS), poly(p-phenylene vinylene) (PPV), polypyridine, poly(3,4-ethylenedioxythiophene) (PEDOT), polystyrene sulfonate (PSS), poly(triaryl amine) (PTAA), poly(hydrooxymethyl 3,4-ethylenedioxythiphene) (PEDOT-OH), or any combination thereof.

In some embodiments, the solution does not comprise at least one of the following metals: at least one of chromium, manganese, hafnium, iron, aluminum, magnesium, potassium, sodium, calcium, strontium, barium, copper, lead, zinc, tin, cobalt, nickel, antimony, mercury, cadmium, bismuth, gold, silver, platinum, ruthenium, rhodium, palladium, iridium, beryllium, lithium, cesium, titanium, zirconium, vanadium, niobium, tantalum, tungsten, molybdenum, gallium, indium, thallium, germanium, rhenium, lanthanum, cerium, praseodymium, neodymium, samarium, europium, gadolinium, terbium, dysprosium, holmium, erbium, thulium, ytterbium, lutetium, scandium, yttrium, thorium, or any combination thereof.

DRAWINGS

Some embodiments are herein described, by way of example only, with reference to the accompanying drawings. With specific reference now to the drawings in detail, it is stressed that the embodiments shown are by way of example and for purposes of illustrative discussion of embodiments of the disclosure. In this regard, the description taken with the drawings makes apparent to those skilled in the art how embodiments of the disclosure may be practiced.

DETAILED DESCRIPTION

Figure 1:
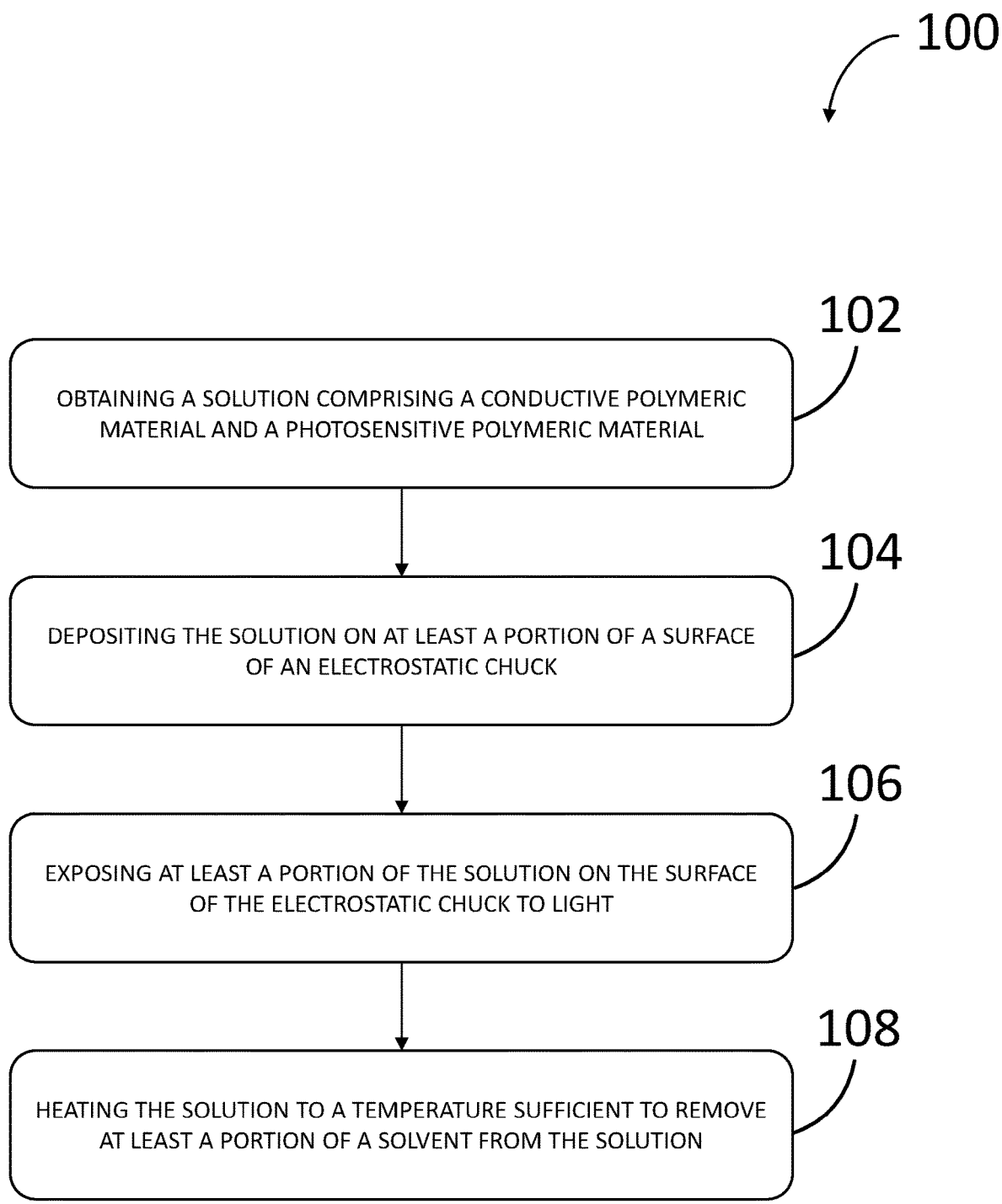
FIG. 1 is a flowchart of a non-limiting embodiment of a method for preparing a conductive polymeric layer, according to some embodiments.

Among those benefits and improvements that have been disclosed, other objects and advantages of this disclosure will become apparent from the following description taken in conjunction with the accompanying figures. Detailed embodiments of the present disclosure are disclosed herein; however, it is to be understood that the disclosed embodiments are merely illustrative of the disclosure that may be embodied in various forms. In addition, each of the examples given regarding the various embodiments of the disclosure which are intended to be illustrative, and not restrictive.

Any prior patents and publications referenced herein are incorporated by reference in their entireties.

Throughout the specification and claims, the following terms take the meanings explicitly associated herein, unless the context clearly dictates otherwise. The phrases "in one embodiment," "in an embodiment," and "in some embodiments" as used herein do not necessarily refer to the same embodiment(s), though it may. Furthermore, the phrases "in another embodiment" and "in some other embodiments" as used herein do not necessarily refer to a different embodiment, although it may. All embodiments of the disclosure are intended to be combinable without departing from the scope or spirit of the disclosure.

As used herein, the term "based on" is not exclusive and allows for being based on additional factors not described, unless the context clearly dictates otherwise. In addition, throughout the specification, the meaning of "a," "an," and "the" include plural references. The meaning of "in" includes "in" and "on."

Some embodiments relate to polymeric layers useful for electrostatic chuck applications. In some embodiments, a conductive polymer is combined with a photosensitive polymer so as to obtain a polymeric layer that is both conductive and photosensitive. The conductivity of the conductive polymer promotes electrostatic charge dissipation by the polymeric layer, while the photosensitivity of the photosensitive polymer allows the surface of the polymeric layer to be photopatterned. The extent to which the polymeric layer is conductive and photosensitive may be modulated by varying the relative amounts of the conductive polymer and the photosensitive polymer. Various other properties of the polymeric layer may also be modulated by varying the relative amounts of the conductive polymer and the photosensitive polymer and optionally by incorporating other materials.

Some embodiments relate to a device comprising a conductive polymeric layer on an electrostatic chuck. In some embodiments, the conductive polymeric layer comprises at least one of a conductive polymeric material, a photosensitive polymeric material (e.g., a crosslinked or non-crosslinked photosensitive polymer), or any combination thereof. In some embodiments, the conductive polymeric layer has a patterned surface (e.g., photopatterned surface). In some of these embodiments, the photosensitive polymeric material comprises a crosslinked photosensitive polymer. In some embodiments, the conductive polymeric layer has a non-patterned surface. (e.g., a non-photopatterned surface). In some of these embodiments, the photosensitive polymeric material comprises a non-crosslinked photosensitive polymer.

Some embodiments relate to an electrostatic chuck comprising a conductive polymeric layer on a surface of the electrostatic chuck. In some embodiments, the conductive polymeric layer comprises at least one of a conductive polymeric material, a photosensitive polymeric material (e.g., a crosslinked or non-crosslinked photosensitive polymer), or any combination thereof. In some embodiments, the conductive polymeric layer has a patterned surface (e.g., photopatterned surface). In some of these embodiments, the photosensitive polymeric material comprises a crosslinked photosensitive polymer. In some embodiments, the conductive polymeric layer has a non-patterned surface. (e.g., a non-photopatterned surface). In some of these embodiments, the photosensitive polymeric material comprises a non-crosslinked photosensitive polymer.

The electrostatic chuck may be configured for securing a substrate to the conductive polymeric layer by application of an electrostatic force. The electrostatic force may be sufficient for securing the substrate to a surface of the conductive polymeric layer. That is, in some embodiments, the substrate may be secured by the electrostatic chuck to the conductive polymeric layer without application of any mechanical force, such as, for example and without limitation, mechanical clamps. In some embodiments, mechanical force is applied to secure the substrate (e.g., via mechanical clamps). The substrate which is secured to the conductive polymeric layer is not particularly limited and may include, for example and without limitation, a wafer, a workpiece, or any combination thereof. In some embodiments, the substrate comprises a semiconductor wafer. In some embodiments, the substrate comprises a silicon wafer. It will be appreciated that other substrates may be used herein without departing from the scope of this disclosure.

The conductive polymeric layer may comprise a conductive polymeric material. The conductive polymeric material may comprise a polymeric material that conducts electricity. In some embodiments, the conductive polymeric material comprises at least one of a conductive monomer, a conductive oligomer, a conductive polymer, or any combination thereof. In some embodiments, the conductive polymeric material comprises a conjugated polymer. In some embodiments, the conductive polymeric material comprises a conductive polymer. In some embodiments, the conductive polymeric material comprises at least one of polyacetylene (PAC), polyfluorene, polyphenylene, polyphenylene vinylene, polypyrene, polyazulene, polynaphthalene, polypyrrole (PPY), polycarbazole, polyindole, polyazepine, polyaniline (PANI), polyacene, polythiophene (PT), polythiophene vinylene, poly(p-phenylene sulfide) (PPS), poly (p-phenylene vinylene) (PPV), polypyridine, poly(3,4-ethylenedioxythiophene) (PEDOT), polystyrene sulfonate (PSS), poly(triaryl amine) (PTAA), poly(hydrooxymethyl 3,4-ethylenedioxythiphene) (PEDOT-OH), or any combination thereof.

The conductive polymeric layer may comprise 0.01% to 99.99%, or any range or subrange therebetween, by weight of the conductive polymeric material based on a total weight of the conductive polymeric layer. For example, in some embodiments, the conductive polymeric layer comprises 0.01% to 99%, 1% to 99%, 10% to 99%, 20% to 99%, 30% to 99%, 40% to 99%, 50% to 99%, 60% to 99%, 70% to 99%, 80% to 99%, 90% to 99%, 0.01% to 90%, 0.01% to 80%, 0.01% to 70%, 0.01% to 60%, 0.01% to 50%, 0.01% to 40%, 0.01% to 30%, 0.01% to 20%, 0.01% to 10%, or any range or subrange therebetween, by weight of the conductive polymeric material based on a total weight of the conductive polymeric layer. In some embodiments, the conductive polymeric layer comprises 10% to 50%, 20% to 50%, 30% to 50%, 40% to 50%, 10% to 40%, 10% to 30%, 10% to 20%, or any range or subrange therebetween, by weight of the conductive polymeric material based on a total weight of the conductive polymeric layer.

The conductive polymeric layer may comprise a photosensitive polymeric material. The photosensitive polymeric material may comprise a polymeric material which undergoes a change in property or structure when exposed to light. In some embodiments, the photosensitive polymeric material comprises at least one of a photosensitive monomer, a photosensitive oligomer, a photosensitive polymer, or any combination thereof. In some embodiments, the photosensitive polymeric material comprises a photosensitive polymer. In some embodiments, the photosensitive polymeric material comprises a crosslinked photosensitive polymer. For example, in some embodiments, a photosensitive polymeric material—such as, a photosensitive monomer, a photosensitive oligomer, or any combination thereof—is exposed to light so as to obtain a crosslinked photosensitive polymer. In some embodiments in which the conductive polymeric layer has a photopatterned surface, the photosensitive polymeric material comprises a crosslinked photosensitive polymer. In some embodiments, the photosensitive polymer comprises a non-crosslinked photosensitive polymer. In some embodiments, the photosensitive polymeric material comprises at least one of benzocyclobutene (BCB), polybenzoxazole (PBO), epoxy, polyimide, or any combination thereof.

The conductive polymeric layer may comprise 0.01% to 99.99%, or any range or subrange therebetween, by weight of the photosensitive polymeric material based on a total weight of the conductive polymeric layer. For example, in some embodiments, the conductive polymeric layer comprises 0.01% to 99%, 1% to 99%, 10% to 99%, 20% to 99%, 30% to 99%, 40% to 99%, 50% to 99%, 60% to 99%, 70% to 99%, 80% to 99%, 90% to 99%, 0.01% to 90%, 0.01% to 80%, 0.01% to 70%, 0.01% to 60%, 0.01% to 50%, 0.01% to 40%, 0.01% to 30%, 0.01% to 20%, 0.01% to 10%, or any range or subrange therebetween, by weight of the photosensitive polymeric material based on a total weight of the conductive polymeric layer. In some embodiments, the conductive polymeric layer comprises 50% to 90%, 50% to 80%, 50% to 70%, 50% to 60%, 60% to 90%, 70% to 90%, 80% to 90%, or any range or subrange therebetween, by weight of the photosensitive polymeric material based on a total weight of the conductive polymeric layer.

The amount of the conductive polymeric material and the photosensitive polymeric material present in the conductive polymeric layer may be tailored to achieve at least one of a desired sheet resistance, a desired Young's modulus, or any combination thereof. For example, the conductive polymeric material and the photosensitive polymeric material may be present in an amount sufficient for the conductive polymeric layer to have at least one of a desired sheet resistance, a desired Young's modulus, or any combination thereof.

The conductive polymeric layer may have a sheet resistance of $10^{13}$ ohms per square or less, $10^{12}$ ohms per square or less, $10^{11}$ ohms per square or less, $10^{10}$ ohms per square or less, $10^{9}$ ohms per square or less, $10^{8}$ ohms per square or less, $10^{7}$ ohms per square or less, $10^{6}$ ohms per square or less, or $10^{5}$ ohms per square or less. In some embodiments, the conductive polymeric layer may have a sheet resistance of $10^{2}$ to $10^{10}$ ohms per square, $10^{2}$ to $10^{9}$ ohms per square, $10^{2}$ to $10^{8}$ ohms per square, $10^{2}$ to $10^{7}$ ohms per square, $10^{2}$ to $10^{6}$ ohms per square, $10^{2}$ to $10^{5}$ ohms per square, $10^{2}$ to $10^{4}$ ohms per square, $10^{2}$ to $10^{3}$ ohms per square, $10^{3}$ to $10^{9}$ ohms per square, $10^{4}$ to $10^{9}$ ohms per square, $105$ to $10^{9}$ ohms per square, $10^{6}$ to $10^{9}$ ohms per square, $10^{7}$ to $10^{9}$ ohms per square, $10^{8}$ to $10^{9}$ ohms per square, or any range or subrange therebetween.

The conductive polymeric layer may have a Young's modulus of 3.5 gigapascals (GPa) or less, 3 gigapascals (GPa) or less, 2.5 gigapascals (GPa) or less, 2 gigapascals (GPa) or less, 1.5 gigapascals (GPa) or less, 1 gigapascals (GPa) or less, 0.5 gigapascals (GPa) or less, 0.1 gigapascals (GPa) or less, or 0.01 gigapascals (GPa) or less. In some embodiments, the conductive polymeric layer may have a Young's modulus of 0.001 GPa to 1 GPa, 0.001 GPa to 0.9 GPa, 0.001 GPa to 0.8 GPa, 0.001 GPa to 0.7 GPa, 0.001 GPa to 0.6 GPa, 0.001 GPa to 0.5 GPa, 0.001 GPa to 0.4 GPa, 0.001 GPa to 0.3 GPa, 0.001 GPa to 0.2 GPa, +0.001 GPa to 0.1 GPa, 0.001 GPa to 0.01 GPa, 0.001 GPa to 3.5 GPa, 0.01 GPa to 3.5 GPa, 0.1 GPa to 3.5 GPa, 1 GPa1 to 3.5 GPa, 1.5 GPa to 3.5 GPa, 2 GPa to 3.5 GPa, 2.5 GPa to 3.5 GPa, 3 GPa to 3.5 GPa, 0.001 GPa to 3 GPa, 0.001 GPa to 2.5 GPa, 0.001 GPa to 2 GPa, 0.001 GPa to 1.5 GPa, 0.001 GPa to 1 GPa, 0.001 GPa to 0.5 GPa, 0.001 GPa to 0.1 GPa, 0.001 GPa to 0.01 GPa, or any range or subrange therebetween.

The conductive polymeric layer may comprise a conductive photopatterned polymeric layer. That is, in some embodiments, the conductive polymeric layer comprises a conductive polymeric material, such as, for example, a conductive polymer, and a photosensitive polymeric material, such as, for example, a crosslinked photosensitive polymer. In some embodiments, the photosensitive polymer is crosslinked such that the conductive polymeric layer has a photopatterned surface. In some embodiments, the conductive photopatterned layer comprises a protrusion or a plurality of protrusions. The protrusion(s) or the surface of the conductive photopatterned layer may define a substrate contact surface (e.g., a wafer contact surface). The protrusion(s) may have any geometric configuration. In some embodiments, for example, the protrusion(s) form pillars, among other structures. In some embodiments, the protrusion(s) have at least one dimension in a range of 1 μm to 100 μm, or any range or subrange therebetween.

The thickness of the conductive polymeric layer may be in a range of 1 μm to 50 μm. For example, in some embodiments, the thickness of the conductive polymeric layer is in a range of 1 μm to 50 μm, 1 μm to 45 μm, 1 μm to 40 µm, 1 µm to 35 µm, 1 µm to 30 µm, 1 µm to 25 µm, 1 µm to 20 µm, 1 µm to 15 µm, 1 µm to 10 µm, 1 µm to 5 µm, 5 µm to 50 µm, 10 µm to 50 µm, 15 µm to 50 µm, 20 µm to 50 µm, 25 µm to 50 µm, 30 µm to 50 µm, 35 µm to 50 µm, 40 µm to 50 µm, 45 µm to 50 µm, or any range or subrange therebetween. In some embodiments, the thickness of the conductive polymeric layer is in a range of 5 µm to 25 µm, 5 µm to 20 µm, 5 µm to 15 µm, or any range or subrange therebetween.

In some embodiments, the conductive polymeric layer does not comprise a metal contaminant. In some embodiments, the metal contaminant comprises, consists of, or consists essentially of at least one of chromium, manganese, hafnium, iron, aluminum, magnesium, potassium, sodium, calcium, strontium, barium, copper, lead, zinc, tin, cobalt, nickel, antimony, mercury, cadmium, bismuth, gold, silver, platinum, ruthenium, rhodium, palladium, iridium, beryllium, lithium, cesium, titanium, zirconium, vanadium, niobium, tantalum, tungsten, molybdenum, gallium, indium, thallium, germanium, rhenium, lanthanum, cerium, praseodymium, neodymium, samarium, europium, gadolinium, terbium, dysprosium, holmium, erbium, thulium, ytterbium, lutetium, scandium, yttrium, thorium, or any combination thereof.

In some embodiments, the conductive polymeric layer comprises 0.01% to 10%, or any range or subrange therebetween, by weight of the metal contaminant based on the total weight of the conductive polymer layer. For example, in some embodiments, the conductive polymeric layer comprises less than 10%, less than 9%, less than 8%, less than 7%, less than 6%, less than 5%, less than 4%, less than 3%, less than 2% less than 1%, less than 0.1% by weight of the metal contaminant based on the total weight of the conductive polymeric layer. In some embodiments, the conductive polymeric layer comprises 0.01% to 10%, 0.01% to 9%, 0.01% to 8%, 0.01% to 7%, 0.01% to 6%, 0.01% to 5%, 0.01% to 4%, 0.01% to 3%, 0.01% to 2%, 0.01% to 1%, 1% to 10%, 2% to 10%, 3% to 10%, 4% to 10%, 5% to 10%, 6% to 10%, 7% to 10%, 8% to 10%, 9% to 10%, or any range or subrange therebetween.

In some embodiments, the conductive polymeric layer comprises at least one of an additive, a binding agent, a solvent, a dopant, a surfactant, or any combination thereof. In some embodiments, the additive does not comprise a metal (e.g., the metal contaminant(s) disclosed herein). In some embodiments, the binding agent does not comprise a metal (e.g., the metal contaminant(s) disclosed herein). In some embodiments, the solvent does not comprise a metal (e.g., the metal contaminant(s) disclosed herein). In some embodiments, the dopant does not comprise a metal (e.g., the metal contaminant(s) disclosed herein). In some embodiments, the surfactant does not comprise a metal (e.g., the metal contaminant(s) disclosed herein).

The conductive polymeric layer may comprise 0.01% to 99%, or any range or subrange therebetween, by weight of at least one of the additive, the binding agent, the solvent, the dopant, the surfactant, or any combination thereof, based on a total weight of the conductive polymeric layer. For example, in some embodiments, the conductive polymeric layer may comprise 0.01% to 99%, 1% to 99%, 10% to 99%, 20% to 99%, 30% to 99%, 40% to 99%, 50% to 99%, 60% to 99%, 70% to 99%, 80% to 99%, 90% to 99%, 0.01% to 90%, 0.01% to 80%, 0.01% to 70%, 0.01% to 60%, 0.01% to 50%, 0.01% to 40%, 0.01% to 30%, 0.01% to 20%, 0.01% to 10%, or any range or subrange therebetween, by weight of at least one of the additive, the binding agent, the solvent, the dopant, the surfactant, or any combination thereof, based on a total weight of the conductive polymeric layer. In some embodiments, the conductive polymeric layer comprises 50% to 90%, 50% to 80%, 50% to 70%, 50% to 60%, 60% to 90%, 70% to 90%, 80% to 90%, or any range or subrange therebetween, by weight of at least one of the additive, the binding agent, the solvent, the dopant, the surfactant, or any combination thereof, based on a total weight of the conductive polymeric layer.

FIG. 1 is a flowchart of a non-limiting embodiment of a method 100 for preparing a conductive polymeric layer, according to some embodiments. The conductive polymeric layer may comprise any of the conductive polymeric layers disclosed herein.

At step 102, a solution comprising a conductive polymeric material and a photosensitive polymeric material is obtained. In some embodiments, the solution comprises a homogenous mixture of the conductive polymeric material and the photosensitive polymeric material. In some embodiments, the solution further comprises a solvent. In some embodiments, the solvent comprises at least one of gamma butyrolactone, propylene glycol methyl ether acetate, acetone, dodecane, cyclopentanone, or any combination thereof.

At step 104, the solution is deposited on at least a portion of a surface of an electrostatic chuck. The depositing may comprise coating (e.g., spray coating, sonication spray coating, spin coating, etc. or otherwise applying) on at least a portion of the surface of the electrostatic chuck. In some embodiments, the solution is deposited on the surface of the electrostatic chuck so as to form a coating, a layer, or a film. In some embodiments, the solution deposited on the surface of the electrostatic chuck has a thickness of 0.1 µm to 1 mm, or any range or subrange therebetween. In some embodiments, a thickness of the solution deposited on the surface of the electrostatic chuck is 1 µm to 10 µm, 1 µm to 9 µm, 1 µm to 8 µm, 1 µm to 7 µm, 1 µm to 6 µm, 1 µm to 5 µm, 1 µm to 4 µm, 1 µm to 3 µm, 1 µm to 2 µm, 2 µm to 10 µm, 3 µm to 10 µm, 4 µm to 10 µm, 5 µm to 10 µm, 6 µm to 10 µm, 7 µm to 10 µm, 8 µm to 10 µm, 9 µm to 10 µm, or any range or subrange therebetween. In some embodiments, the solution is deposited so as to cover an entire surface of the electrostatic chuck.

At step 106, at least a portion of the solution on the surface of the electrostatic chuck is exposed to light. The solution may be exposed to light of any wavelength. For example, the solution may be exposed to at least one of gamma rays, x-rays, ultraviolet light, visible light, infrared light, radio waves, microwaves, or any combination thereof. The duration of the exposure should be sufficient to cure the solution.

Although not shown, in some embodiments, the method further comprises one or more of the following steps, which may optionally be performed between steps 106 and 108: applying a photolithography mask so as to define exposed portions of the solution and unexposed portions of the solution; exposing the solution to light so as to cure the exposed portions of the solution; and developing the solution so as to remove at least a portion of the unexposed portions of the solution. In some of these embodiments, developing the solution results in formation of a patterned surface in which the unexposed portions are removed and the exposed portions remain.

At step 108, the solution is heated to a temperature sufficient to remove at least a portion of a solvent from the solution. The temperature is not particularly limited and may be, for example and without limitation, a temperature in a range of 150° C. to 400° C., or any subrange therebetween.

The duration of the heating is not particularly limited and should be of a duration sufficient to complete or at least complete in part the process of solvent removal from the solution. In some embodiments, the heating forms the conductive polymeric layer. In some embodiments, the conductive polymeric layer is a patterned conductive polymeric layer (e.g., a photopatterned conductive polymeric layer). In some embodiments, the conductive polymeric layer is a non-patterned conductive polymeric layer.

Figure 2:
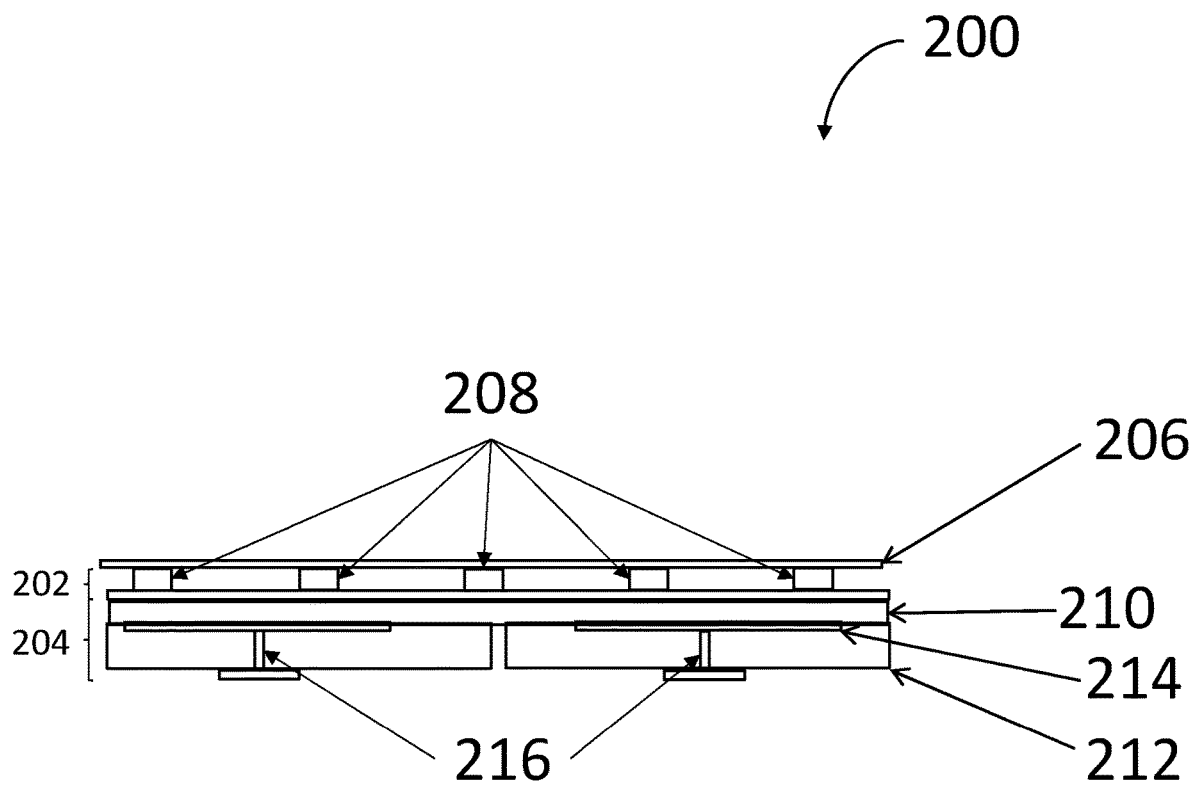
FIG. 2 is a cross-sectional view of a non-limiting embodiment of a device, according to some embodiments.

FIG. 2 is a cross-sectional view of a non-limiting embodiment of a device 200, according to some embodiments. As shown in FIG. 2, the device 200 comprises a conductive polymeric layer 202 on an electrostatic chuck 204. The conductive polymeric layer 202 may comprise a plurality of protrusions 208 which define a photopatterned surface and which define a substrate contact surface. In the illustrated embodiment, the electrostatic chuck 204 is configured to secure a substrate 206 to the conductive polymeric layer 202 by application of an electrostatic force. The substrate 206 may include, for example and without limitation, a silicon wafer or other semiconductor substrate.

The electrostatic chuck 204 may comprise a dielectric layer 210 and an insulator layer 212. In some embodiments, the dielectric layer 210 has a first surface and a second surface opposite the first surface. In some embodiments, the first surface of the dielectric layer 210 is bonded to the conductive polymeric layer 202. In some embodiments, the second surface of the dielectric layer 210 is bonded to the insulator layer 212.

The device 200 may comprise electrodes 214. The electrodes 214 may be positioned below a top surface of the electrostatic chuck 204. In some embodiments, the electrodes 214 are bonded to electrode pins 216 (e.g., optionally by an electrically conductive epoxy, among other materials). In some embodiments, the electrode pins 216 extend from the electrodes 214 through the insulator layer 212 as shown. It will be appreciated that other configurations of the electrodes 214, dielectric layer 210, and insulator layer 212 may be employed without departing from the scope of this disclosure. It will further be appreciated that the electrostatic chuck 204 may comprise other components without departing from the scope of this disclosure.

Aspects

Various Aspects are described below. It is to be understood that any one or more of the features recited in the following Aspect(s) can be combined with any one or more other Aspect(s).

Aspect 1. A device comprising:
an electrostatic chuck; and
a conductive polymeric layer on the electrostatic chuck, wherein the conductive polymeric layer comprises a conductive polymer and a photosensitive polymer.

Aspect 2. The device according to aspect 1, wherein the electrostatic chuck is configured for securing a substrate by application of an electrostatic force.

Aspect 3. The device according to any one of aspects 1-2, wherein the conductive polymeric layer has a sheet resistance of $10^{12}$ ohms per square or less.

Aspect 4. The device according to any one of aspects 1-3, wherein the conductive polymeric layer has a Young's modulus of 3.5 gigapascals (GPa) or less.

Aspect 5. The device according to any one of aspects 1-4, wherein the conductive polymeric layer comprises 0.01% to 99.99% by weight of the photosensitive polymer based on a total weight of the conductive polymeric layer.

Aspect 6. The device according to any one of aspects 1-5, wherein the photosensitive polymer comprises at least one of benzocyclobutene (BCB), polybenzoxazole (PBO), epoxy, polyimide, or any combination thereof.

Aspect 7. The device according to any one of aspects 1-6, wherein the photosensitive polymer comprises a crosslinked photosensitive polymer.

Aspect 8. The device according to any one of aspects 1-6, wherein the photosensitive polymer comprises a non-crosslinked photosensitive polymer.

Aspect 9. The device according to any one of aspects 1-8, wherein the conductive polymeric layer comprises 0.01% to 99.99% by weight of the conductive polymer based on a total weight of the conductive polymeric layer.

Aspect 10. The device according to any one of aspects 1-9, wherein the conductive polymer comprises a conjugated polymer.

Aspect 11. The device according to any one of aspects 1-10, wherein the conductive polymer comprises at least one of polyacetylene (PAC), polyfluorene, polyphenylene, polyphenylene vinylene, polypyrene, polyazulene, polynaphthalene, polypyrrole (PPY), polycarbazole, polyindole, polyazepine, polyaniline (PANI), polyacene, polythiophene (PT), polythiophene vinylene, poly(p-phenylene sulfide) (PPS), poly(p-phenylene vinylene) (PPV), polypyridine, poly(3,4-ethylenedioxythiophene) (PEDOT), polystyrene sulfonate (PSS), poly(triaryl amine) (PTAA), poly(hydrooxymethyl 3,4-ethylenedioxythiphene) (PEDOT-OH), or any combination thereof.

Aspect 12. The device according to any one of aspects 1-11, wherein the conductive polymeric layer has a photopatterned surface.

Aspect 13. The device according to aspect 12, wherein the photopatterned surface defines a substrate contact surface.

Aspect 14. The device according to aspect 12, wherein the photopatterned surface comprises a protrusion.

Aspect 15. The device according to aspect 14, wherein the protrusion having at least one dimension in a range of 1 µm to 100 µm.

Aspect 16. The device according to any one of aspects 1-15, wherein the conductive polymeric layer has a thickness of 1 µm to 50 µm.

Aspect 17. The device according to any one of aspects 1-16, wherein the conductive polymeric layer does not comprise a metal contaminant.

Aspect 18. The device according to aspect 17, wherein the metal contaminant comprises at least one chromium, manganese, hafnium, iron, aluminum, magnesium, potassium, sodium, calcium, strontium, barium, copper, lead, zinc, tin, cobalt, nickel, antimony, mercury, cadmium, bismuth, gold, silver, platinum, ruthenium, rhodium, palladium, iridium, beryllium, lithium, cesium, titanium, zirconium, vanadium, niobium, tantalum, tungsten, molybdenum, gallium, indium, thallium, germanium, rhenium, lanthanum, cerium, praseodymium, neodymium, samarium, europium, gadolinium, terbium, dysprosium, holmium, erbium, thulium, ytterbium, lutetium, scandium, yttrium, thorium, or any combination thereof.

Aspect 19. The device according to any one of aspects 1-18, wherein the conductive polymeric layer further comprises at least one of an additive, a binding agent, a solvent, a dopant, a surfactant, or any combination thereof.

Aspect 20. The device according to aspect 19, wherein the additive, the binding agent, the solvent, the dopant, and the surfactant do not comprise a metal.

Aspect 21. An electrostatic chuck comprising:
a conductive polymeric layer on the electrostatic chuck, wherein the conductive polymeric layer comprises a conductive polymer and a photosensitive polymer.

Aspect 22. The electrostatic chuck according to aspect 21, wherein the conductive polymeric layer has a sheet resistance of $10^{12}$ ohms per square or less.

Aspect 23. The electrostatic chuck according to any one of aspects 21-22, wherein the conductive polymeric layer has a Young's modulus of 3.5 gigapascals (GPa) or less.

Aspect 24. The electrostatic chuck according to any one of aspects 21-23, wherein the conductive polymeric layer comprises 0.01% to 99.99% by weight of a photosensitive polymer based on a total weight of the conductive polymeric layer.

Aspect 25. The electrostatic chuck according to any one of aspects 21-24, wherein the photosensitive polymer comprises at least one of benzocyclobutene (BCB), polybenzoxazole (PBO), epoxy, polyimide, or any combination thereof.

Aspect 26. The electrostatic chuck according to any one of aspects 21-25, wherein the photosensitive polymer comprises a crosslinked photosensitive polymer.

Aspect 27. The electrostatic chuck according to any one of aspects 21-25, wherein the photosensitive polymer comprises a non-crosslinked photosensitive polymer.

Aspect 28. The electrostatic chuck according to any one of aspects 21-27, wherein the conductive polymeric layer comprises 0.01% to 99.99% by weight of the conductive polymer based on a total weight of the conductive polymeric layer.

Aspect 29. The electrostatic chuck according to any one of aspects 21-28, wherein the conductive polymer comprises a conjugated polymer.

Aspect 30. The electrostatic chuck according to any one of aspects 21-29, wherein the conductive polymer comprises at least one of polyacetylene (PAC), polyfluorene, polyphenylene, polyphenylene vinylene, polypyrene, polyazulene, polynaphthalene, polypyrrole (PPY), polycarbazole, polyindole, polyazepine, polyaniline (PANI), polyacene, polythiophene (PT), polythiophene vinylene, poly(p-phenylene sulfide) (PPS), poly(p-phenylene vinylene) (PPV), polypyridine, poly(3,4-ethylenedioxythiophene) (PEDOT), polystyrene sulfonate (PSS), poly(triaryl amine) (PTAA), poly(hydrooxymethyl 3,4-ethylenedioxythiphene) (PEDOT-OH), or any combination thereof.

Aspect 31. The electrostatic chuck according to any one of aspects 21-30, wherein the conductive polymeric layer has a photopatterned surface.

Aspect 32. The electrostatic chuck according to aspect 31, wherein the photopatterned surface defines a substrate contact surface.

Aspect 33. The electrostatic chuck according to aspect 31, wherein the photopatterned surface comprises a protrusion.

Aspect 34. The electrostatic chuck according to aspect 33, wherein the protrusion having at least one dimension in a range of 1 μm to 100 μm.

Aspect 35. The electrostatic chuck according to any one of aspects 21-34, wherein the conductive polymeric layer has a thickness of 1 μm to 50 μm.

Aspect 36. The electrostatic chuck according to any one of aspects 21-35, wherein the conductive polymeric layer does not comprise a metal contaminant.

Aspect 37. The electrostatic chuck according to aspect 36, wherein the metal contaminant comprises at least one chromium, manganese, hafnium, iron, aluminum, magnesium, potassium, sodium, calcium, strontium, barium, copper, lead, zinc, tin, cobalt, nickel, antimony, mercury, cadmium, bismuth, gold, silver, platinum, ruthenium, rhodium, palladium, iridium, beryllium, lithium, cesium, titanium, zirconium, vanadium, niobium, tantalum, tungsten, molybdenum, gallium, indium, thallium, germanium, rhenium, lanthanum, cerium, praseodymium, neodymium, samarium, europium, gadolinium, terbium, dysprosium, holmium, erbium, thulium, ytterbium, lutetium, scandium, yttrium, thorium, or any combination thereof.

Aspect 38. The electrostatic chuck according to any one of aspects 21-37, wherein the conductive polymeric layer further comprises at least one of an additive, a binding agent, a solvent, a dopant, a surfactant, or any combination thereof.

Aspect 39. The electrostatic chuck according to aspect 38, wherein the additive, the binding agent, the solvent, the dopant, and the surfactant do not comprise a metal.

Aspect 40. A method comprising:
obtaining a solution comprising a conductive polymer and a photosensitive polymer;
depositing the solution on at least a portion of a surface of an electrostatic chuck;
exposing at least a portion of the solution on the surface of the electrostatic chuck to light; and
heating the solution to a temperature sufficient to remove at least a portion of a solvent from the solution.

Aspect 41. The method according to aspect 40, wherein the solution comprises a homogenous mixture of the conductive polymer and the photosensitive polymer.

Aspect 42. The method according to any one of aspects 40-41, wherein the solvent comprises at least one of gamma butyrolactone, propylene glycol methyl ether acetate, acetone, dodecane, cyclopentanone, or any combination thereof.

Aspect 43. The method according to any one of aspects 40-42, wherein depositing comprises spray coating.

Aspect 44. The method according to any one of aspects 40-43, wherein the deposited solution covers an entire surface of the electrostatic chuck.

Aspect 45. The method according to any one of aspects 40-44, wherein exposing comprises exposing the solution to light of any wavelength.

Aspect 46. The method according to any one of aspects 40-4, further comprising one or more of:
applying a photolithography mask so as to define exposed portions of the solution and unexposed portions of the solution;
exposing the solution to light so as to cure the exposed portions of the solution; and
developing the solution so as to remove at least a portion of the unexposed portions of the solution.

Aspect 47. The method according to any one of aspects 40-46, wherein heating comprises heating to a temperature in a range of 150° C. to 400° C.

Aspect 48. The method according to any one of aspects 40-47, wherein the conductive polymer comprises at least one of polyacetylene (PAC), polyfluorene, polyphenylene, polyphenylene vinylene, polypyrene, polyazulene, polynaphthalene, polypyrrole (PPY), polycarbazole, polyindole, polyazepine, polyaniline (PANI), polyacene, polythiophene (PT), polythiophene vinylene, poly(p-phenylene sulfide) (PPS), poly(p-phenylene vinylene) (PPV), polypyridine, poly(3,4-ethylenedioxythiophene) (PEDOT), polystyrene sulfonate (PSS), poly(triaryl amine) (PTAA), poly(hydrooxymethyl 3,4-ethylenedioxythiphene) (PEDOT-OH), or any combination thereof.

Aspect 49. The method according to any one of aspects 40-48, wherein the solution does not comprise at least one of the following metals: at least one of chromium, manganese, hafnium, iron, aluminum, magnesium, potassium, sodium, calcium, strontium, barium, copper, lead, zinc, tin, cobalt, nickel, antimony, mercury, cadmium, bismuth, gold, silver, platinum, ruthenium, rhodium, palladium, iridium, beryllium, lithium, cesium, titanium, zirconium, vanadium, niobium, tantalum, tungsten, molybdenum, gallium, indium, thallium, germanium, rhenium, lanthanum, cerium, praseodymium, neodymium, samarium, europium, gadolinium, terbium, dysprosium, holmium, erbium, thulium, ytterbium, lutetium, scandium, yttrium, thorium, or any combination thereof.

It is to be understood that changes may be made in detail, especially in matters of the construction materials employed and the shape, size, and arrangement of parts without departing from the scope of the present disclosure. This Specification and the embodiments described are examples, with the true scope and spirit of the disclosure being indicated by the claims that follow.

What is claimed is:

1. A device comprising:
   an electrostatic chuck; and
   a conductive polymeric layer on the electrostatic chuck, wherein the conductive polymeric layer comprises a conductive polymer and a photosensitive polymer.

2. The device according to claim 1, wherein the electrostatic chuck is configured for securing a substrate by application of an electrostatic force.

3. The device according to claim 1, wherein the conductive polymeric layer has a sheet resistance of $10^{12}$ ohms per square or less.

4. The device according to claim 1, wherein the conductive polymeric layer has a Young's modulus of 3.5 gigapascals (GPa) or less.

5. The device according to claim 1, wherein the photosensitive polymer is selected from the group consisting of benzocyclobutene (BCB), polybenzoxazole (PBO), epoxy, polyimide, or any combination thereof.

6. The device according to claim 1, wherein the conductive polymer is selected from the group consisting of polyacetylene (PAC), polyfluorene, polyphenylene, polyphenylene vinylene, polypyrene, polyazulene, polynaphthalene, polypyrrole (PPY), polycarbazole, polyindole, polyazepine, polyaniline (PANI), polyacene, polythiophene (PT), polythiophene vinylene, poly(p-phenylene sulfide) (PPS), poly(p-phenylene vinylene) (PPV), polypyridine, poly(3,4-ethylenedioxythiophene) (PEDOT), polystyrene sulfonate (PSS), poly(triaryl amine) (PTAA), poly(hydrooxymethyl 3,4-ethylenedioxythiphene) (PEDOT-OH), or any combination thereof.

7. The device according to claim 1, wherein the photosensitive polymer is crosslinked such that the conductive polymeric layer has a photopatterned surface.

8. The device according to claim 1, wherein the conductive polymeric layer does not comprise a metal contaminant.

9. The device according to claim 8, wherein the metal contaminant is selected from the group consisting of chromium, manganese, hafnium, iron, aluminum, magnesium, potassium, sodium, calcium, strontium, barium, copper, lead, zinc, tin, cobalt, nickel, antimony, mercury, cadmium, bismuth, gold, silver, platinum, ruthenium, rhodium, palladium, iridium, beryllium, lithium, cesium, titanium, zirconium, vanadium, niobium, tantalum, tungsten, molybdenum, gallium, indium, thallium, germanium, rhenium, lanthanum, cerium, praseodymium, neodymium, samarium, europium, gadolinium, terbium, dysprosium, holmium, erbium, thulium, ytterbium, lutetium, scandium, yttrium, thorium, or any combination thereof.

10. An electrostatic chuck comprising:
    a conductive polymeric layer on the electrostatic chuck, wherein the conductive polymeric layer comprises a conductive polymer and a photosensitive polymer.

11. The electrostatic chuck according to claim 10, wherein the conductive polymeric layer has a sheet resistance of $10^{12}$ ohms per square or less.

12. The electrostatic chuck according to claim 10, wherein the conductive polymeric layer has a Young's modulus of 3.5 gigapascals (GPa) or less.

13. The electrostatic chuck according to claim 10, wherein the photosensitive polymer comprises at least one of benzocyclobutene (BCB), polybenzoxazole (PBO), epoxy, polyimide, or any combination thereof.

14. The electrostatic chuck according to claim 10, wherein the conductive polymer is selected from the group consisting of polyacetylene (PAC), polyfluorene, polyphenylene, polyphenylene vinylene, polypyrene, polyazulene, polynaphthalene, polypyrrole (PPY), polycarbazole, polyindole, polyazepine, polyaniline (PANI), polyacene, polythiophene (PT), polythiophene vinylene, poly(p-phenylene sulfide) (PPS), poly(p-phenylene vinylene) (PPV), polypyridine, poly(3,4-ethylenedioxythiophene) (PEDOT), polystyrene sulfonate (PSS), poly(triaryl amine) (PTAA), poly(hydrooxymethyl 3,4-ethylenedioxythiphene) (PEDOT-OH), or any combination thereof.

15. The electrostatic chuck according to claim 10, wherein the photosensitive polymer is crosslinked such that the conductive polymeric layer has a photopatterned surface.

16. The electrostatic chuck according to claim 10, wherein the conductive polymeric layer does not comprise a metal contaminant.

17. The electrostatic chuck according to claim 16, wherein the metal contaminant is selected from the group consisting of chromium, manganese, hafnium, iron, aluminum, magnesium, potassium, sodium, calcium, strontium, barium, copper, lead, zinc, tin, cobalt, nickel, antimony, mercury, cadmium, bismuth, gold, silver, platinum, ruthenium, rhodium, palladium, iridium, beryllium, lithium, cesium, titanium, zirconium, vanadium, niobium, tantalum, tungsten, molybdenum, gallium, indium, thallium, germanium, rhenium, lanthanum, cerium, praseodymium, neodymium, samarium, europium, gadolinium, terbium, dysprosium, holmium, erbium, thulium, ytterbium, lutetium, scandium, yttrium, thorium, or any combination thereof.

* * * * *